United States Patent [19]
Ohtani et al.

[11] Patent Number: 5,585,291
[45] Date of Patent: Dec. 17, 1996

[54] METHOD FOR MANUFACTURING A SEMICONDUCTOR DEVICE CONTAINING A CRYSTALLIZATION PROMOTING MATERIAL

[75] Inventors: Hisashi Ohtani, Isehara; Akiharu Miyanaga, Hadano; Junichi Takeyama, Atsugi, all of Japan

[73] Assignee: Semiconductor Energy Laboratory Co., Ltd., Kanagawa-ken, Japan

[21] Appl. No.: 350,114

[22] Filed: Nov. 29, 1994

[30] Foreign Application Priority Data

Dec. 2, 1993 [JP] Japan .................................. 5-339397

[51] Int. Cl.⁶ .................................. H01L 21/225
[52] U.S. Cl. .................. 437/40; 437/230; 437/233; 437/245; 437/88; 437/164; 148/DIG. 16
[58] Field of Search .................................. 437/233, 967, 437/973, 245, 230, 142, 159, 21, 40, 41, 164, 88; 148/DIG. 1, DIG. 122, DIG. 150, DIG. 16

[56] References Cited

U.S. PATENT DOCUMENTS

| 3,108,914 | 10/1963 | Hoerni ................................ 437/142 |
| 3,389,024 | 6/1968 | Schimmer . |
| 3,783,049 | 1/1974 | Sandera ............................... 437/159 |
| 3,873,384 | 3/1975 | Chang . |
| 3,886,569 | 5/1975 | Basi et al. . |
| 3,988,762 | 10/1976 | Cline et al. ......................... 437/159 |
| 4,090,915 | 5/1978 | Keller ................................. 437/164 |
| 4,091,527 | 5/1978 | Goodman et al. ................... 437/164 |
| 4,110,488 | 8/1978 | Risko ................................. 437/175 |
| 4,619,719 | 10/1986 | Thomas et al. ...................... 437/164 |
| 5,147,826 | 9/1992 | Liu et al. ........................... 437/233 |
| 5,275,851 | 1/1994 | Fonash et al. ...................... 437/233 |
| 5,403,772 | 4/1995 | Zhang et al. ....................... 437/233 |

FOREIGN PATENT DOCUMENTS

| 55-59762 | 5/1980 | Japan . |
| 55-121653 | 9/1980 | Japan . |
| 1-206632 | 8/1989 | Japan . |
| 2-140915 | 5/1990 | Japan . |
| 7-66195 | 3/1995 | Japan . |
| 9201090 | 1/1992 | WIPO . |

OTHER PUBLICATIONS

R. Anton, Thin Solid Films, 118 (1984) 293 "Interaction of Au, Pt and Au–Pt with Oxidized Si . . . ".
S. Wolf & R. N. Tauber, "Silicon Processing for the VLSI Era" vol. I, 1986 pp. 516–517.
M. Meuris et al., Jpn. J. Appl. Phys., 31 (11A) (1992) L1514 ". . . Gate oxide integrity in $NH_4OH/H_2O_2$ Mixtures".
J. Stoemenos et al., Appl. Phys. Lett., 58(11) (1991) 1196 "Crystallization of a–Si . . . Utilizing Au".
Y. Kawazu et al., Jpn. J. Appl. Phys. 29(12) (1990) 2698 ". . . Crystallization of a–Si:H induced By Nickel Silicide".
J. T. Mayer et al., Surface Science, 265 (1992) 102 ". . . Diffusion of Adsorbed Ni on ultrathin . . . $SiO_2$".
M. Morita et al., Appl. Phys. Lett., 49(12) (1986) 699 ". . . F enhanced photo–oxidation of Silicon . . . ".
M. Morita et al., Jpn. J. Appl. Phys., 29(12) (1990) 2392 "Native Oxide Growth . . . in Hydrogen Peroxide".

(List continued on next page.)

*Primary Examiner*—Charles L. Bowers, Jr.
*Assistant Examiner*—Leon Radomsky
*Attorney, Agent, or Firm*—Sixbey, Friedman, Leedom & Ferguson, PC; Gerald J. Ferguson, Jr.; Jeffrey L. Costellia

[57] ABSTRACT

A method for manufacturing a semiconductor device having a crystalline silicon semiconductor layer comprises the steps of heat crystallizing an amorphous silicon semiconductor layer at a relatively low temperature because of the use of a crystallization promoting material such as Ni, Pd, Pt, Cu, Ag, Au, In, Sn, Pb, P, As, and Sb. The crystallization promoting material is introduced by mixing it within a liquid precursor material for forming silicon oxide and coating the precursor material onto the amorphous silicon film. Thus, it is possible to add the crystallization promoting material into the amorphous silicon film at a minimum density.

30 Claims, 8 Drawing Sheets

OTHER PUBLICATIONS

C. Hayzelden et al., "In Situ Transmission Electron Microscopy Studies of Silicide–Mediated Crystallization of Amorphous Silicon" Appl. Phys. Lett. 60(2) (1992) 225.

A. V. Dvurechenskii et al., "Transport Phenomena in Amorphous Silicon Doped by Ion Implantation of 3d Metals", Phys. Stat. Sol. A 95 (1986) 635.

T. Hempel et al., "Needle–Like Crystallization of Ni Doped Amorphous Silicon Thin Films", *Solid State Communications,* vol. 85, No. 11, pp. 921–924, 1993.

"Crystallized Si Films By Low–Temperature Rapid Thermal Annealing Of Amorphous Silicon", R. Kakkad, J. Smith, W. S. Lau, S. J. Fonash, J. Appl. Phys. 65 (5), Mar. 1, 1989, 1989 American Institute of Physics, pp. 2069–2072.

"Polycrystalline Silicon Thin Film Transistors on Corning 7059 Glass Substrates Using Short Time, Low Temperature Processing", G. Liu, S. J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S. J. Fonash, Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S. J. Fonash, Journal of Non–Crystalline Solids, vol. 115 (1989), pp. 66–68.

METHOD FOR MANUFACTURING A SEMICONDUCTOR DEVICE CONTAINING A CRYSTALLIZATION PROMOTING MATERIAL

BACKGROUND OF THE INVENTION

The present invention relates to a process for manufacturing a semiconductor device having a crystalline semiconductor. The present invention further relates to thin film transistors (TFT) used in integrated circuits, especially, for switching elements in an active matrix circuit in an electro-optical device or a driving circuit thereof formed on the same substrate as the active matrix circuit.

An amorphous silicon film can be utilized most readily as the thin film semiconductor for a TFT. However, the electric characteristics of the amorphous silicon film are poorer than a crystalline thin film semiconductor, for example, polycrystalline silicon, single crystalline silicon, and microcrystalline silicon. A crystalline silicon film can be prepared by first forming an amorphous silicon film, and then heat treating the resulting film for crystallization.

The heat treatment for the crystallization of the amorphous silicon film requires heating the film at a temperature of 600° C. or higher for a duration of 10 hours or longer. Such a heat treatment is detrimental for a glass substrate. For instance, a Corning 7059 glass commonly used for the substrate of active matrix liquid crystal display devices has a glass distortion point of 593° C., and is therefore not suitable for large area substrates that are subjected to heating at a temperature of 600° C. or higher.

According to the study of the present inventors, it was found that the crystallization of an amorphous silicon film can be effected by heating the film at 550° C. for a duration of about 4 hours by the provision of a trace amount of nickel or palladium, or other elements such as lead, onto the surface of the amorphous silicon film.

The elements above (hereinafter referred to as "catalyst elements capable of promoting the crystallization of an amorphous silicon film" or simply as "catalyst elements") can be introduced into the surface of the amorphous silicon film by depositing the elements by plasma treatment or vapor deposition, or by introducing the elements by ion implantation. The plasma treatment is a treatment in which the catalyst elements are added into the amorphous silicon film by generating a plasma in an atmosphere such as gaseous hydrogen or nitrogen using an electrode containing the catalyst elements therein in a plasma CVD apparatus of a parallel plate type or positive columnar type.

However, the presence of the catalyst elements in a large quantity in the semiconductor is not preferred, because the use of such semiconductors greatly impairs the reliability and the electric stability of the device in which the semiconductor is used.

That is, the catalyst elements are necessary in the crystallization of the amorphous silicon film, but are preferably not incorporated in the crystallized silicon so much. In order to satisfy these requirements, it is necessary to select an element which tends to be inactive in crystalline silicon as the catalyst element, and to make the amount of the element added in the silicon film minimum. For this purpose, the quantity of the catalyst element to be incorporated in the film must be controlled with high precision.

The crystallization process using nickel was studied in detail. The following findings were obtained as a result:

(1) In case of incorporating nickel by plasma treatment into an amorphous silicon film, nickel is found to intrude into the film to a considerable depth of the amorphous silicon film before subjecting the film to a heat treatment;

(2) The initial nucleation occurs from the surface at which nickel is added; and (3) When a nickel layer is formed on the amorphous silicon film by vapor deposition, the crystallization of an amorphous silicon film occurs in the same manner as in the case of effecting a plasma treatment.

(4) When incorporating a relatively large amount of nickel into an amorphous silicon film, if a laser is irradiated onto the amorphous silicon film for crystallization or after a heat crystallization thereof, the nickel tends to segregate at the surface of the film, resulting in that such a film can not be used as an active semiconductor layer.

In view of the foregoing, it is assumed that not all of the nickel introduced by the plasma treatment functions to promote the crystallization of silicon. That is, if a large amount of nickel is introduced, there exists an excess amount of the nickel which does not function for promoting the crystallization. For this reason, the inventors consider that it is a point or a face at which the nickel contacts the silicon that functions to promote the crystallization of the silicon at lower temperatures. Namely, it is assumed that the nickel has to be minutely dispersed in the silicon in the form of atoms. Namely, it is assumed that nickel needs to be dispersed in the vicinity of a surface of an amorphous silicon film in the form of atoms, and the concentration of the nickel should be as small as possible but within a range which is sufficiently high to promote the lower temperature crystallization.

A trace amount of nickel, i.e., a catalyst element capable of accelerating the crystallization of silicon can be incorporated in the vicinity of a surface of an amorphous silicon film by, for example, vapor deposition. However, vapor deposition is disadvantageous concerning the controllability of the film, and is therefore that is not suitable for precisely controlling the amount of the catalyst element to be incorporated in the amorphous silicon film.

SUMMARY OF THE INVENTION

In the light of the aforementioned circumstances, a primary feature of the present invention is to obtain a crystalline silicon film at low temperatures using a catalyst element for promoting a crystallization thereof than the temperature which is needed if the catalyst element is not used. In particular, the highest process temperature should be 600° C. or less. It is a further object of the present invention to control (and minimize) the concentration of the catalyst element in the crystalline silicon film and to improve productivity.

It is still a further object of the invention to manufacture a semiconductor device which has a crystalline silicon semiconductor in which at least one electrical junction such PN, PI or NI is formed, for example, thin film transistor, diode, photo sensor, etc.

In order to achieve the foregoing objects of the invention and in accordance with the most generic concept of the invention, it is the primary features of the present invention to dispose a film which contains a catalyst element or compound thereof in contact with a silicon film, and to crystallize the silicon with the aid of the catalyst element which diffuses into the silicon film.

The typical example of the film to provide the catalyst is a silicon oxide film which is formed from a solution by spin coating or the like. A silicon oxide film is most readily available as a dielectric film for a semiconductor device. That is, a catalyst material is added to a solution which contains silicon oxide therein following which the solution is coated on a surface to form a silicon oxide film added with a small amount of the catalyst element.

BRIEF DESCRIPTION OF THE DRAWINGS

The foregoing and other features of the present invention will be further described in preferred embodiments of the present invention with reference to the attached drawings in which.

DETAILED DESCRIPTION OF THE INVENTION

In accordance with the present invention, a silicon oxide film which contains a catalyst in an atomic form or a compound form is disposed in contact with a silicon film, especially on an amorphous silicon film, and the silicon film with the silicon oxide film in contact therewith is crystallized by heat annealing. During the heat annealing, the catalyst element diffuses from the silicon oxide film into the amorphous silicon film to promote the crystallization thereof.

In a most preferred embodiment of the present invention, the silicon oxide film containing the catalyst element is formed using a solution which is used to form a silicon oxide film. The catalyst element or a compound thereof is held in the solution at a predetermined concentration. The use of the silicon oxide film is advantageous because it is easily formed by coating and can endure a high temperature during a heat crystallization.

The above method of the present invention has the following advantages:

(a) The concentration of a catalyst in a solution can be accurately controlled;

(b) The amount of a catalyst element to be incorporated in a silicon film can be determined by the concentration of the catalyst element in the solution if the solution is provided in contact with a surface of the silicon film; and (c) A catalyst element which is adsorbed by the surface of an amorphous silicon film mainly function as a catalyst for promoting the crystallization so that the amount of the catalyst in the silicon can be minimized.

A most typical example of a solution for preparing a silicon oxide film to hold a catalyst element is an OCD (Ohka Diffusion Source) solution which is manufactured by Tokyo Ohka Co. Ltd. The OCD comprises a silanol series monomer or oligomer dissolved in an organic solvent such as alcohol or ketone. The OCD also contains proper additives such as an organic binder. It is also possible to use another solution in which fine particles of silicon oxide are dissolved or dispersed in an organic solvent. For examples, NT-L6008, NHC AT-732, NHC AT-741R, and NHC CT-3301, trade names by Nissan Kagaku Kogyo Kabushikigaisha, may be used as a starting material of the silicon oxide film.

For example, when using the OCD solution and nickel as a catalyst element, the following methods may be applied.

(1) Directly adding a nickel compound into the OCD solution, or (2) Dissolving a nickel compound in a solvent and adding the solvent into the OCD solution.

In the case of the above method (1), the nickel compound has to be dissolved in the solvent of the OCD. For example, nickel acetyl acetonate or 2-ethyl hexanoic acid nickel are usable.

In the case of using the above method (2), a solvent such as water, alcohol, ester, or ketone can be used for dissolving a nickel compound. However, it is preferable to use the same solvent which is the component of the OCD solution.

Examples of a nickel compound which is usable with an alcohol as a solvent are nickel bromide nickel acetate, nickel oxalate, nickel chloride, nickel iodide, nickel nitrate, nickel sulfate, nickel formate, nickel acetyl acetonate, and 4-cyclohexyl nickel butyric acid.

Also, it is useful to add an interfacial activation agent into a solution containing the catalyst. Further, it is useful to apply an adhesion improving agent such as HMDS (hexamethyl silazane), for example, OAP produced by Tokyo Ohka Kogyo onto a surface to be coated with the solution containing a catalyst element in order to increase an adhesion therebetween.

In the above examples, a nickel compound is completely dissolved in a solution. However, it is possible to use a solution such as an emulsion in which an elemental nickel or a nickel compound is homogeneously dispersed, and to add such a solution into OCD.

Other catalyst elements other than nickel may be used in the same manner as explained above.

The amount of a catalyst to be added into a solution should be about 20–5000 ppm, preferably, 200–2000 ppm with respect to an OCD solution which contains silicon oxide at a concentration 2.0 wt %, although it depends upon a kind of the solution to be used.

Also, it is possible to selectively perform a crystallization of an amorphous silicon film by applying an OCD solution containing a catalyst element onto a selected portion of the silicon film. In particular, the crystallization proceeds from a region onto which the silicon oxide film is formed toward a region onto which the silicon oxide film is not applied. In such a case, crystals grow approximately in parallel with a surface of the silicon film, and the inventors of this invention calls such a region as a lateral growth region hereinbelow.

The lateral growth region of the crystalline film tends to contain the catalyst element at a lower concentration as compared with the region onto which the catalyst containing silicon oxide is directly provided. Therefore, the lateral growth region is particularly advantageous as an active region of a semiconductor device since a concentration of impurities in an active region should generally be lowered. Accordingly, it is advantageous to manufacture a semiconductor device using the lateral growth region as an active region thereof.

In the present invention, nickel is disclosed as a most preferred catalyst element. However, it is to be understood that other catalyst elements may be used in a similar manner. Examples of such elements are Pd, Pt, Cu, Ag, Au, In, Sn, Pb, P, As and Sb. It is also possible to select one or more elements selected from the groups VIII, IIIb, IVb and Vb elements of the Japanese periodic table.

In the case of using Fe, it is possible to use a iron salt, for example, $FeBr_2 6H_2O$, $FeBr_3 6H_2O$, $Fe(C_2H_3O_2)_3 xH_2O$, $FeCl_2 4H_2O$, $FeCl_3 6H_2O$, $FeF_3 3H_2O$, $Fe(NO_3)9H_2O$, $Fe_3(PO_4)8H_2O$, and $FePO_4 2H_2O$.

In the case of using Co, it is possible to use a cobalt salt, for example, $CoBr 6H_2O$, $Co(C_2H_3O_2)_2 4H_2O$, $CoCl_2 6H_2O$, $CoF_2 xH_2O$, and $Co(NO_3)_2 6H_2O$.

In the case of using Ru, it is possible to use a ruthenium salt, for example, $RuCl_3 H_2O$.

In the case of using Rh, it is possible to use a rhodium salt, for example, $RhCl_3 3H_2O$.

In the case of using Pd, it is possible to use a palladium salt, for example, $PdCl_2 2H_2O$.

In the case of using Os, it is possible to use an osmium salt, for example, $OsCl_3$.

In the case of using Ir, it is possible to use an iridium salt, for example, $IrCl_3 3H_2O$ and $IrCl_4$.

In the case of using Pt, it is possible to use platinum salt, for example, $PtCl_4 5H_2O$.

In the case of using Cu, it is possible to use a copper compound such as $Cu(CH3COO)_2$, $CuCl_2 2H_2O$, and $Cu(NO_3)_2 3H_2O$.

In the case of using Au, it is possible to use a gold compound such as $AuCl_3 xH_2O$, $AuHCl_4 4H_2O$, $AuNaCl_4 2H_2O$.

The catalyst element contained in the silicon oxide film formed on an amorphous silicon film diffuses into the amorphous silicon film by a thermal treatment, resulting in promoting a crystallization of the silicon film. It should be noted that the diffusion coefficient of a catalyst element in a silicon oxide film is very small as compared with that in an amorphous silicon film. For this reason, the catalyst element which actually functions to promote the crystallization is only a portion of the catalyst element which exists in the vicinity of the silicon oxide film and the amorphous silicon film. In other words, the catalyst material which exists in only the interface region of the silicon oxide film which contacts the silicon film diffuse into the silicon film. For this reason, the use of the silicon oxide film is advantageous in that the amount of the catalyst to be incorporated into the silicon film can be made uniform even if the thickness of the silicon oxide film is not uniform.

Also, it is possible to control the amount of a catalyst material which diffuses into an amorphous silicon film by controlling a heating time or its temperature.

EXAMPLE 1

In this example, an OCD solution in which a catalyst material is contained is coated onto an amorphous silicon film to form a silicon oxide and then a crystallization is performed.

Figure 1A:
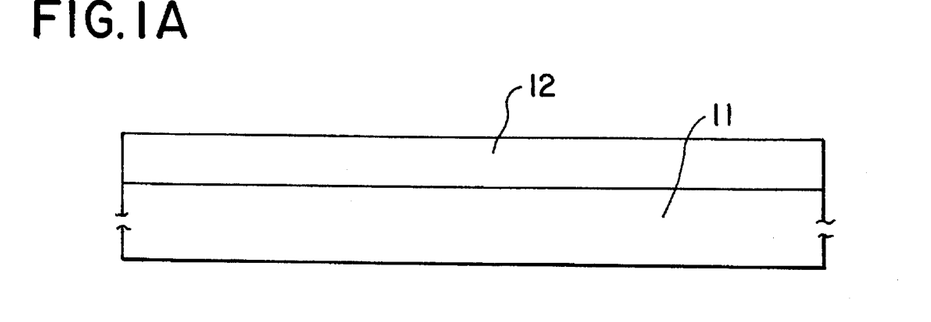
FIGS. 1A–1C show a process for obtaining a crystalline silicon film in accordance with Example 1 of the invention.

Referring to FIG. 1A, a substrate 11 is a Corning 7059 glass having a dimension 100 mm×100 mm. Initially, an amorphous silicon film 12 is formed by a known plasma CVD or LPCVD method to a thickness of 100–1500 Å, for example, 1000 Å.

The formed amorphous silicon film 12 is treated with a hydrofluoric acid in order to remove contaminants or a natural oxide formed thereon. Subsequently, an oxide film 13 which contains nickel as a catalyst element is to be formed in the following manner.

Initially, an OCD solution (OCD Type 2 Si 59000 produced by Tokyo Ohka) is prepared. Also, nickel(II) acetylacetonate is dissolved in a methyl acetate. These solutions are mixed in such a manner that a concentration of $SiO_2$ is controlled to be 2.0 weight % and that of nickel is 200–2000 ppm. This means that the ratio of nickel with respect to silicon oxide in the film is 1:0.1 to 1:0.01.

Figure 1B:
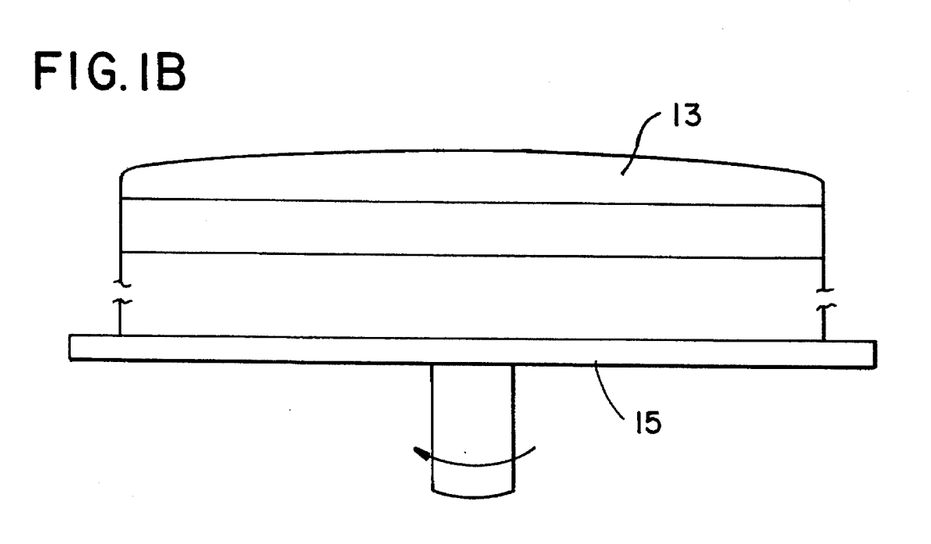

The foregoing mixed solution is dropped at 10 ml onto the surface of the amorphous silicon film 12 following which the substrate is rotated at 2000 rpm for 15 seconds by means of a spinner 15 to perform spin coating. Then, a prebaking is performed at 250° C. for 30 minutes in order to obtain a silicon oxide film 13 having a thickness of 1300 Å which contains nickel therein. The temperature of the prebaking may be determined depending upon the decomposition temperature of the nickel compound used. Also, the thickness of the silicon oxide film can be arbitrarily determined by controlling the rotation speed of the spin coating or the concentration of the silicon oxide with respect to the solution. The inventors consider from their experiments that the thickness of 200–1300 Å is appropriate.

Figure 1C:
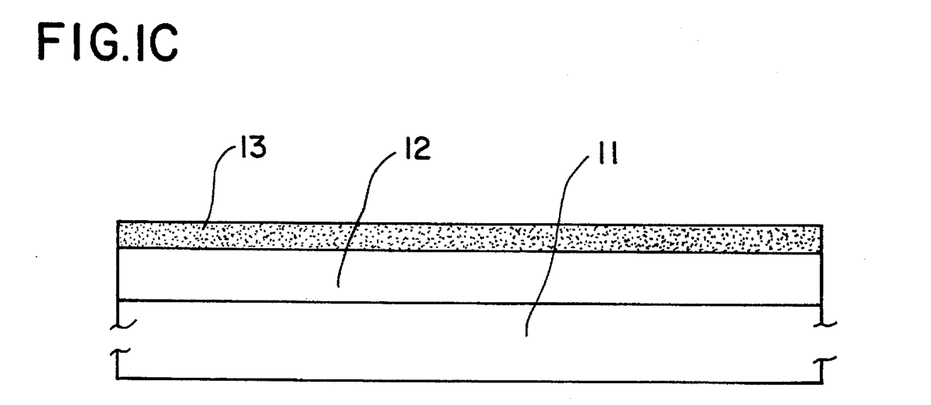

Then, the above structure is heated in a furnace at 550° C. for 4 hours in a nitrogen atmosphere. As a result, a silicon film 12 having a crystallinity is obtained on the substrate 11. The temperature of this heat treatment is preferably 450° C. or higher. If it is below 450° C., the time of the heat treatment should be lengthened so that a productivity can not be improved. Also, when the temperature is higher than 550° C., care should be taken concerning the heat resistivity of the glass substrate.

It is to be understood that the silicon oxide film containing the catalyst element may be formed below the amorphous silicon film. In such a case, the solution is to be formed on the substrate to form a silicon oxide film following which an amorphous silicon film is formed thereon. In this case, the silicon oxide film may have a function of a blocking layer on the glass substrate.

Also, a concentration of nickel in the OCD solution should be determined depending upon a concentration of the $SiO_2$ in the solution. It is necessary to take into consideration that the amount of the nickel which diffuses from the silicon oxide film into the silicon is influenced by the time and the temperature during the heat annealing.

EXAMPLE 2

In this example, a silicon oxide film containing nickel is selectively formed on an amorphous silicon film.

Figure 2A:
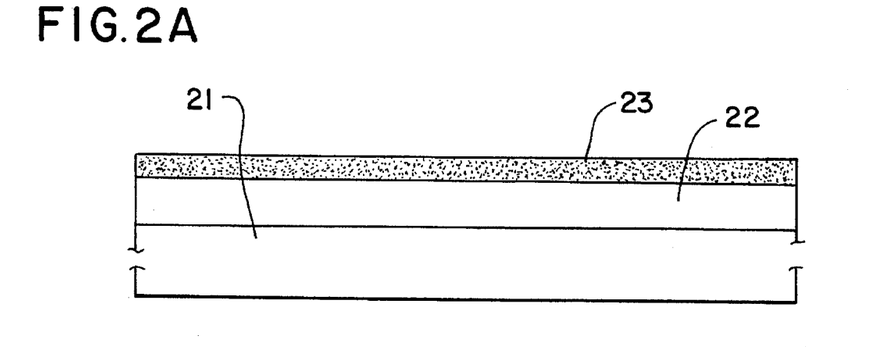
FIGS. 2A–2C show a process for obtaining a crystalline silicon film in accordance with Example 2 of the invention.

Referring to FIG. 2A, a Corning 7059 glass of 10 centimeters square is used as a substrate 21. An amorphous silicon film 22 is formed on the substrate 21 through a known plasma CVD method to 1000 Å thick.

After treating the amorphous silicon film 22 with a hydrofluoric acid to remove contaminants or a natural oxide formed thereon, a silicon oxide film 23 containing nickel is formed on a selected portion of the film in a manner described below.

Initially, nickel(II) acetylacetonate is directly mixed in an OCD solution (OCD Type 2 Si 20000 produced by Tokyo Ohka). A concentration of the nickel element in the OCD solution is controlled to be 200–2000 ppm.

The above solution is dropped at 10 ml onto the surface of the amorphous silicon film 22 following which a spin coating is carried out using a spinner at 2000 rpm for 15 seconds. A nickel containing silicon oxide film 23 of 300 Å thick is formed by prebaking at 250° C. for 30 minutes. The temperature of the prebaking is determined in view of the fact that the decomposition of the nickel(II) acetylacetonate is completed at about 235° C. However, if the temperature of the prebaking is too high, the nickel element tends to diffuse into the amorphous silicon film during the prebaking.

Figure 2B:
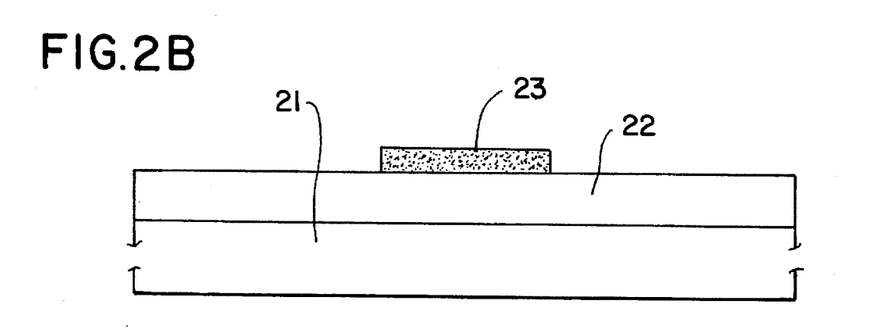

Then the silicon oxide film 23 is patterned into a desired pattern through a known photolithography process. The patterning is easily done using 1/100 HF because an etching rate of the silicon oxide film 23 formed from the OCD solution is as fast as several tens angstroms per second. Accordingly, the silicon oxide film can be patterned without damaging the silicon oxide film 22. As a result, a pattern of silicon oxide film 23 is formed on a selected portion of the amorphous silicon film to which nickel is introduced as shown in FIG. 2B. Also, it is possible to use dry etching if one wishes to obtain a more excellent pattern.

Then, a photoresist (not shown) which was used in the above pattering is removed and the surface is washed with a very thin hydrofluoric acid solution (less than 1/100). The density of the hydrofluoric acid solution should be enough thin in order not to damage the silicon oxide film 23.

Then, the above structure is furnace annealed at 550° C. for 4 hours in a nitrogen atmosphere in order to crystallize the silicon film 22 in the same manner as in Example 1. However, the crystal growth in the present example differs from Example 1 in that the crystals laterally grow from a region 24 toward a region 25 as shown by arrows in FIG. 2C. The region 24 denotes a region into which the nickel is directly introduced from the silicon oxide film formed thereon. the region 25 denotes a region into which the nickel was not directly introduced. The direction of the crystal growth in the lateral growth region is substantially aligned with an axis of [111].

Figure 2C:
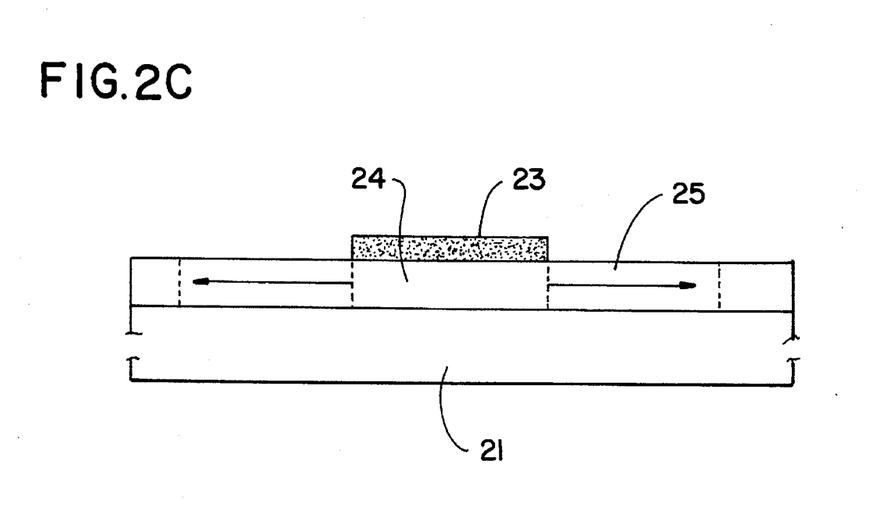

The concentration of the nickel in the region 24 can be controlled within a range of $1 \times 10^{16}$ to $1 \times 10^{19}$ atoms/cm$^3$ by controlling the density of the solution, the heat treatment temperature and time. The concentration of the nickel in the region 25 is less than that. Also, it should be noted that the concentration of the nickel in the silicon film is hardly influenced by the thickness of the silicon oxide film if the thickness is larger than a certain value. This is because the diffusion coefficient of nickel within the silicon oxide is very small so that it is only a portion of the silicon oxide film ranging several tens angstroms in the vicinity of the interface with the silicon film 22 from which nickel diffuses into the silicon film as a catalyst.

The crystalline silicon film thus obtained has an improved resistivity against hydrofluoric acid as compared with the case in which nickel is introduced through a plasma treatment. For example, when it is necessary to pattern a silicon oxide film which is formed over a crystalline silicon film as an interlayer insulator or a gate insulator to form a contact hole, a buffer hydrofluoric acid is usually used as an etchant. If the crystalline silicon film does not have enough resistance against the hydrofluoric acid, it is difficult to selectively remove only the silicon oxide film without damaging the silicon film. However, in the case of the present invention, a large selection ratio (i.e. the difference in the etching rate of the silicon oxide film and the crystalline silicon film) can be obtained so as to remove the silicon oxide film alone.

As said above, the lateral growth region has a smaller concentration of a catalyst element and has an excellent crystallinity. Therefore, this region can be used as an active region of a semiconductor device such as a thin film transistor.

EXAMPLE 3

Figure 3A:
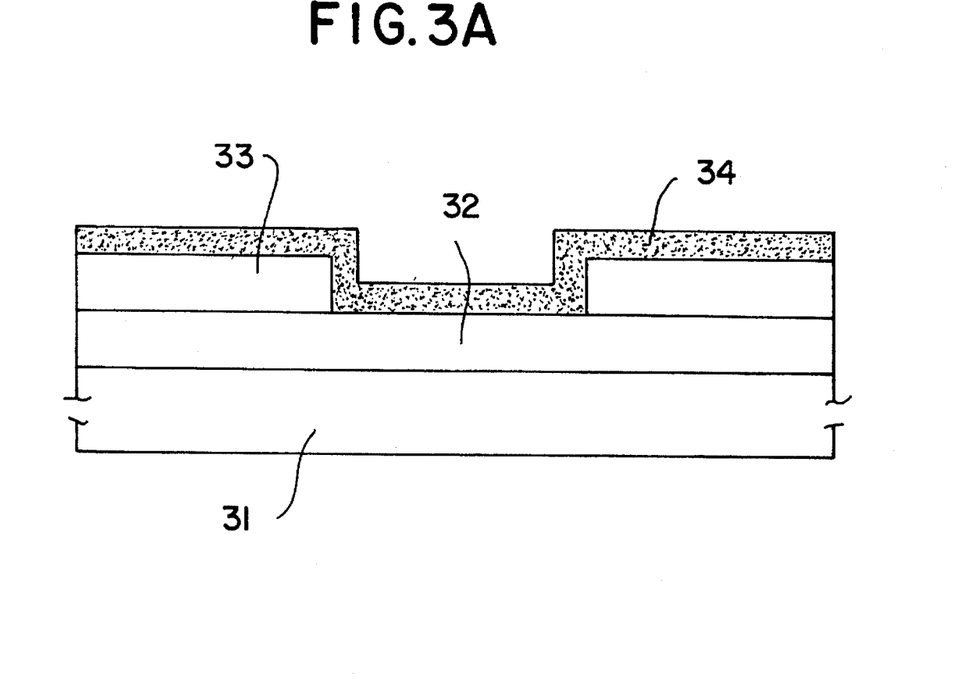
FIGS. 3A and 3B show a process for obtaining a crystalline silicon film in accordance with Example 3 of the invention.

Another example of selectively introducing a catalyst element will be described in this example. Referring to FIG. 3A, an amorphous silicon film 32 is formed on a glass substrate 31 to a thickness of 1000 Å through a known plasma CVD. Then, a silicon oxide film 33 is formed to a thickness of 1000 Å following which it is patterned to form a mask.

After removing contaminants or natural oxide from the surface by using a hydrofluoric acid, a silicon oxide film 34 which contains nickel as a catalyst is formed in a manner described below.

Initially, a 2-ethyl hexanoic acid nickel solution is mixed into an OCD solution (OCD Type 2 Si 59000 produced by Tokyo Ohka) in such a manner that a concentration of SiO$_2$ in the solution is 4.0 wt % and that of nickel is 200–2000 ppm.

The above solution is dropped in an amount of 10 ml onto a surface of amorphous silicon film 32 following which a spin coating is performed using a spinner at 2000 rpm for 15 seconds. As a result, a step caused by the step of the mask 33 is almost disappeared from a surface. Then, a prebaking is performed at 350° C. for 60 minutes in order to form a silicon oxide film 34 which contains nickel. During the prebaking, the nickel diffuses into the amorphous silicon film 32 from the region 35. Accordingly, the amount of nickel diffused into the silicon film may be controlled by changing the time and temperature of the prebaking.

Figure 3B:
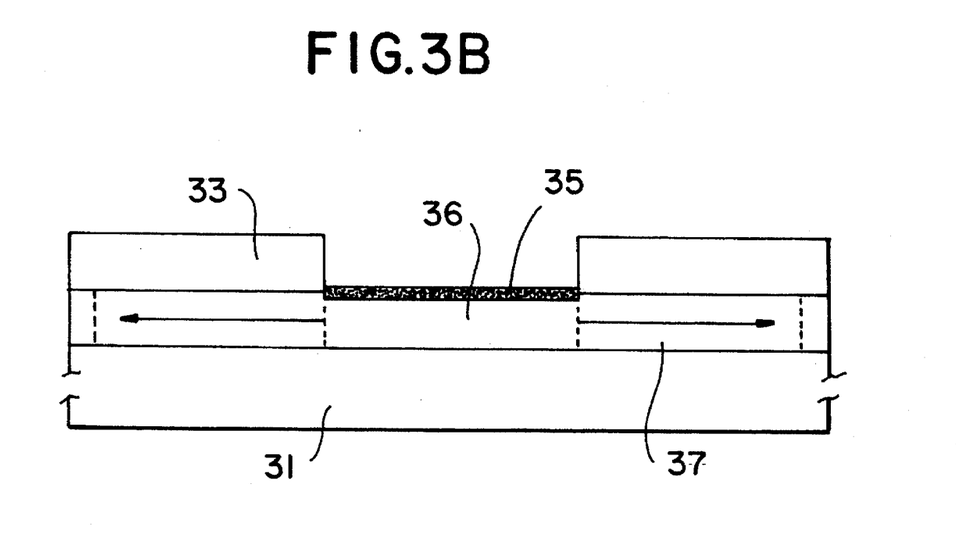

After the above prebaking, the silicon oxide film 34 is removed if necessary to leave the portion 35 of the silicon film as shown in FIG. 3B. Also, the region 35 contains nickel at a very high concentration. The silicon oxide film 34 which is formed from an OCD solution can be easily removed as said before.

Then, the amorphous silicon film 32 is crystallized by heating at 550° C. for 4 hours in a nitrogen atmosphere. At this time, crystals grow from a region 36 to a region 37 as shown by arrows in the figure. The region 36 is a region into which the nickel is directly introduced while the region 37 is a region to which the nickel is not directly introduced.

A surface of the region 37 of the crystalline silicon film has a {111} plane. This is because the crystal growth occurs in the region 37 with its surface covered with the silicon oxide film. On the other hand, the lateral growth region 25 in Example 2 does not has a {111} plane. This is because the crystal growth occurs i the region 25 with its surface uncovered, namely, the surface is a free surface.

EXAMPLE 4

Figure 4A:
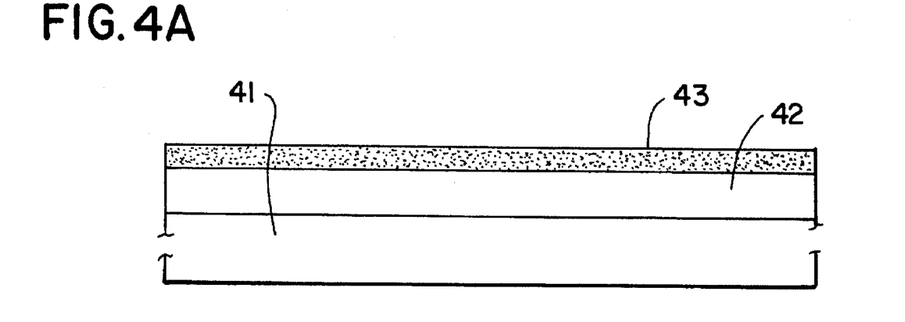
FIGS. 4A–4D show a process for obtaining a crystalline silicon film in accordance with Example 4 of the invention.

In this example, a crystallized silicon film formed in accordance with the present invention is further irradiated with a laser light to improve crystallinity. Referring to FIG. 4A, an amorphous silicon film 42 is formed to a thickness of 1000 Å by a known plasma CVD on a Corning 7059 glass substrate 41 of a 10 centimeters square.

After treating the amorphous silicon film 44 with a hydrofluoric acid to remove contaminants or a natural oxide formed thereon, a silicon oxide film 43 containing nickel is formed on a selected portion of the film in a manner described below.

Initially, nickel(II) acetylacetonate is directly mixed in an OCD solution (OCD Type 2 Si 20000 produced by Tokyo Ohka). A concentration of the nickel element in the OCD solution is controlled to be 200–2000 ppm.

The above solution is dropped in an amount of 10 ml onto the surface of the amorphous silicon film 22 following which a spin coating is carried out using a spinner at 2000 rpm for 15 seconds. A nickel containing silicon oxide film 43 of 1300 Å thick is formed by a prebaking at 250° C. for 30 minutes. The temperature of the prebaking is determined in view of the fact that the decomposition of the nickel(II) acetylacetonate is completed at about 235° C. However, if the temperature of the prebaking is too high, the nickel element tends to diffuse into the amorphous silicon film during the prebaking.

Figure 4B:
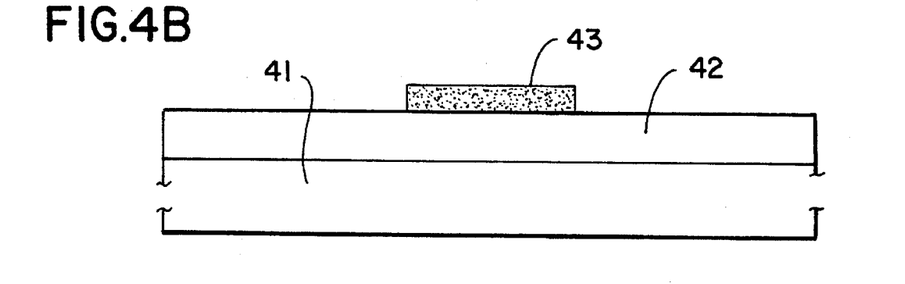

Then the silicon oxide film 43 is patterned into a desired pattern through a known photolithography process. The patterning is easily done using 1/100 HF because an etching rate of the silicon oxide film 43 formed from the OCD solution is as fast as several tens angstroms per second. Accordingly, the silicon oxide film can be patterned without damaging the silicon oxide film 42. As a result, a pattern of silicon oxide film 43 is formed on a selected portion of the amorphous silicon film to which nickel is introduced as shown in FIG. 4B.

Then, a photoresist which was used in the above patterning step is removed and the surface is washed with a very thin hydrofluoric acid solution (less than 1/100). The density of the hydrofluoric acid solution should be enough thin in order not to damage the silicon oxide film 43.

Then, the above structure is furnace annealed at 550° C. for 4 hours in a nitrogen atmosphere in order to crystallize the silicon film 42. The crystals laterally grow from a region 44 toward a region 45 as shown by arrows in FIG. 4C. The region 44 denotes a region into which the nickel is directly introduced by the silicon oxide film formed thereon while the region 45 denotes a region into which the nickel was not directly introduced. The direction of the crystal growth in the lateral growth region is substantially aligned with the crystalline axis of [111].

Figure 4C:
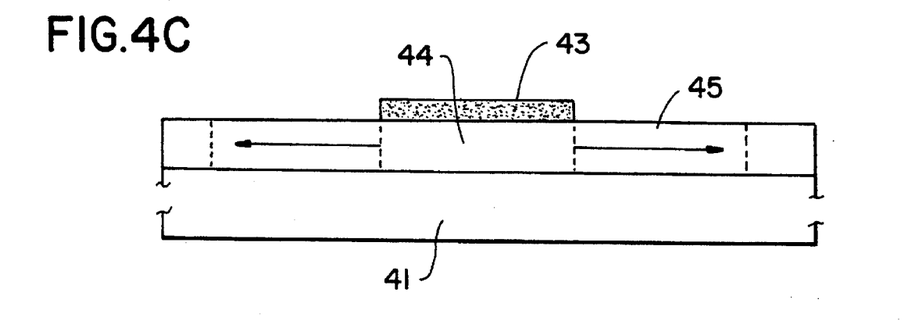

The concentration of the nickel in the region 44 can be controlled within a range of $1\times10^{16}$ to $1\times10^{19}$ atoms/cm$^3$ by controlling the density of the solution, the heat treatment temperature and time. The concentration of the nickel in the region 45 can be made less than that. Also, it should be noted that the concentration of the nickel in the silicon film is hardly influenced by the thickness of the silicon oxide film if the thickness is larger than a certain value.

Figure 4D:
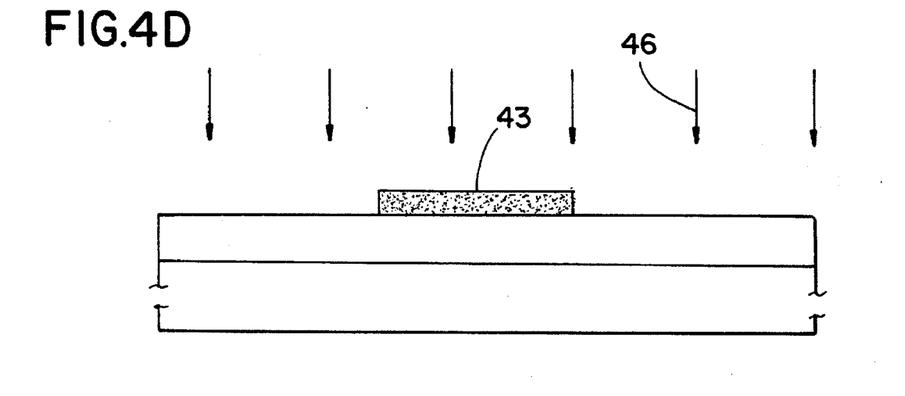

In the present example, the entire surface of the crystallized silicon film thus obtained is further irradiated with a laser light 46 as shown in FIG. 4D in order to further increase the crystallinity. For example, a KrF excimer laser (wavelength: 248 nm) with a power density 200 mJ/cm$^2$ to 350 mJ/cm$^2$, for example, 350 mJ/cm$^2$ is used.

At this irradiation, since the region 44 to which the nickel is directly introduced is poorer in resistivity against laser irradiation than the region 45, the silicon oxide film 43 functions as a blocking layer against the laser light.

Also, when the laser irradiation is performed with the silicon oxide film 43 formed thereon, it is desirable not to heat the substrate so much in order to prevent nickel from diffusing from the silicon oxide film 43 into the silicon film. For example, the substrate should be maintained at a temperature not higher than 300° C. Alternatively, if the silicon oxide film 43 is removed before the laser irradiation, the substrate may be heated to a higher temperature during the laser irradiation. However, the intensity of the laser beam has to be controlled in order not to damage the region 44.

Thus, it is possible to further increase the crystallinity of the silicon film as compared with the case in which only a laser irradiation is used for crystallization.

Also, instead of a laser, it is possible to use other intense light sources such as a flash lamp, in particular, infrared ray irradiation. Since infrared ray is not so absorbed by a glass substrate, it is possible to heat only the silicon film. This irradiation is generally called as a rapid thermal annealing (RTA) or rapid thermal process (RTP).

EXAMPLE 5

An example of manufacturing a TFT as a pixel TFT in accordance with the present invention will be described in this example. The TFT can be used as a switching element which is provided in each pixel of an active matrix liquid crystal device. Also, the TFT may be used in a so called thin film integrated circuit.

Figure 5A:
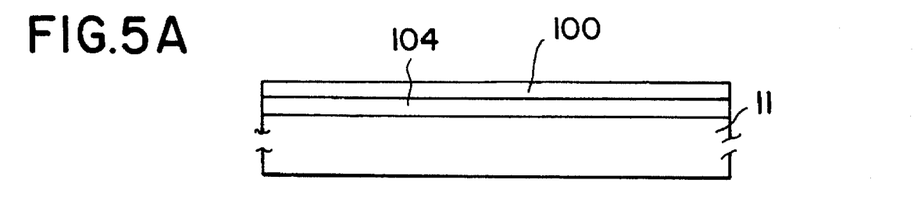
FIGS. 5A–5E show a process of manufacturing a TFT in accordance with Example 5 of the invention.

Referring to FIG. 5A, a glass substrate 11 having a silicon oxide layer of 2000 Å, (not shown) as an impurity blocking layer is prepared. On the substrate, an amorphous silicon film 104 is formed to 1000 Å thick through a known plasma CVD. On the amorphous silicon film 104, a nickel containing silicon oxide film 100 is formed in the same manner as described in Example 1.

Figure 5B:
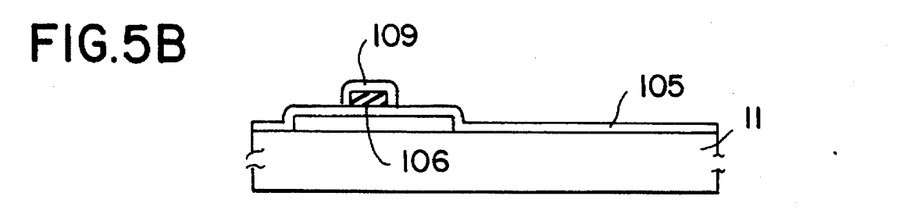

The amorphous silicon film is crystallized by heat annealing with the silicon oxide 100 formed thereon. After the crystallization, the silicon oxide film 100 is removed by using a buffer hydrofluoric acid, following which the crystalline silicon film is patterned into a silicon island 116 as shown in FIG. 5B. Source, drain and channel regions are to be formed in the silicon island 116.

Then, referring to FIG. 5B, a silicon oxide film 105 is formed to a thickness of 200–1500 Å, for example, 1000 Å as a gate insulating film. The silicon oxide film 105 is deposited by means of RF plasma CVD process using TEOS (tetraethoxysilane). That is, TEOS is decomposed and then deposited together with oxygen at a substrate temperature of 150° to 600° C., preferably in the range of 300° to 450° C. The pressure ratio of TEOS and oxygen is 1:1 to 1:3 with a total pressure of 0.05 to 0.5 Torr. An RF power is 100 to 250W. Otherwise, the silicon oxide film can be formed by reduced pressure CVD or normal pressure CVD using TEOS as the starting gas together with gaseous ozone, while maintaining the substrate temperature in the range of from 350° to 600° C., preferably, in the range of from 400° to 550° C. The film thus deposited is annealed in oxygen or under ozone in the temperature range from 400° to 600° C. for a duration of from 30 to 60 minutes.

Then, optionally, a KrF excimer laser (wavelength 248 nm, pulse width 20 nsec) or an intense light equivalent thereto is irradiated in order to improve the crystallinity. In particular, an application of RTA (rapid thermal annealing) using infrared radiation is particularly effective because the silicon film can be heated selectively without heating the glass substrate. Moreover, RTA is especially useful in the fabrication of insulated gate field effect semiconductor devices because it decreases the interface level between a silicon layer and a silicon oxide film.

Subsequently, an aluminum film is deposited to a thickness of 2,000 Å to 1 μm through an electron beam evaporation, and is patterned to form a gate electrode 106. The aluminum film may contain scandium at 0.15–0.2 weight %. The substrate is then immersed into an ethylene glycol solution controlled to a pH of about 7 and containing 1 to 3% tartaric acid to effect an anodic oxidation using platinum as a cathode and the aluminum gate electrode as an anode. The anodic oxidation is effected by first increasing the voltage to 220V at a constant rate, and then holding the voltage at 220V for 1 hour to complete the oxidation. During maintaining the constant current condition, the voltage is preferably increased at a rate of from 2 to 5V/minute. An anodic oxide 109 is formed at a thickness of from 1,500 to 3,500 Å, for example, 2,000 Å.

Figure 5C:
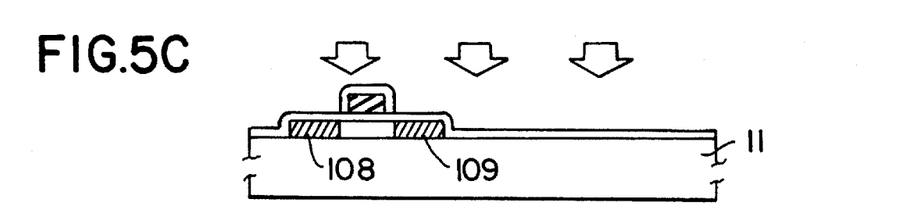

Then, referring to FIG. 5C, phosphorous ions are introduced into a portion of the silicon island by an ion doping method (also called plasma doping) using the gate electrode portion as a mask in a self-alignment manner. As a doping gas, phosphine ($PH_3$) is used. The dose amount is $1$–$4 \times 10^{15}$ atoms/$cm^2$. Further, a KrF excimer laser (wavelength 248 nm, pulse width 20 nsec) is irradiated in order to cure the crystallinity which has been damaged due to the ion doping. The energy density of the laser is 150–400 mJ/$cm^2$, preferably, 200–250 mJ/$cm^2$. Thus, n-type impurity regions 108 and 109 are formed. The sheet resistance in these regions is 200–800 Ω/square.

This step of laser annealing can be replaced by an RTA process, i.e., a rapid thermal annealing process using a flash lamp, which comprises elevating the temperature of the silicon film rapidly to a range of from 1,000° to 1,200° C. (as measured on the silicon monitor).

Figure 5D:
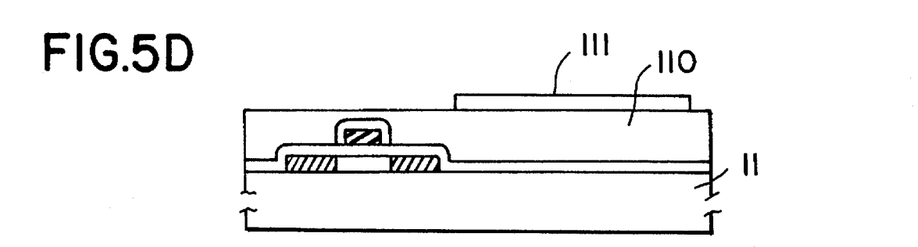

Referring to FIG. 5D, a silicon oxide film is deposited thereafter to a thickness of 3,000 Å as an interlayer insulator 110 by means of plasma CVD using TEOS together with oxygen, or by means of reduced pressure CVD or normal pressure CVD using TEOS together with ozone. The substrate temperature is in the range of 250° to 450° C., for instance, 350° C. A smooth surface is obtained thereafter by mechanically polishing the resulting silicon oxide film. An ITO coating is deposited thereon by sputtering, and is patterned to provide a pixel electrode 111.

Figure 5E:
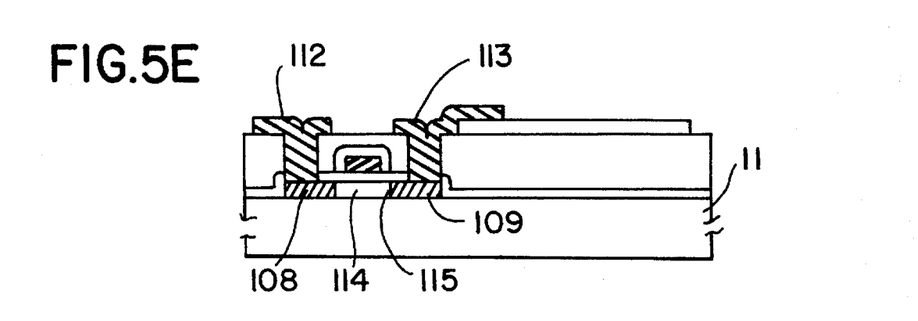

The interlayer insulator 110 is etched to form contact holes in the source/drain as shown in FIG. 5E, and interconnections 112 and 113 are formed using chromium or titanium nitride to connect the interconnection 113 to the pixel electrode 111.

Since the crystalline silicon film formed in the present invention has a sufficient resistance against hydrofluoric acid, it is possible to use a hydrofluoric acid aquarous solution of 10 ppm aqueous to form the contact holes with a good reliability.

Finally, the structure is annealed in hydrogen in a temperature range of 300° to 400° C. for 0.1 to 2 hours to hydrogenize the silicon film. Thus, a TFT is manufactured. A plurality of TFTs having the same structure may be simultaneously formed on the same substrate in order to form an active matrix circuit of a liquid crystal device. The TFT shown in FIG. 5E has source and drain regions 108 and 109 and a channel region 114. Also, the reference numeral 115 shows an NI junction.

In accordance with the present example, the concentration of the nickel contained in the active layer is in the range of $1 \times 10^{16}$ to $3 \times 10^{18}$ atoms/$cm^3$.

EXAMPLE 6

In this example, an active region of a semiconductor device is formed by using a region of a crystalline silicon film in which crystals grow in a lateral direction (i.e. parallel with a substrate surface). By using such a region, it is possible to reduce a concentration of a catalyst element in the active region. Thus, electrical characteristics and reliability of a device can be improved.

This example is particularly directed to a manufacture of a TFT used to control a pixel of an active matrix device. FIGS. 6A–6F are cross sectional views for showing the manufacture of the TFT in accordance with this example.

Figure 6A:
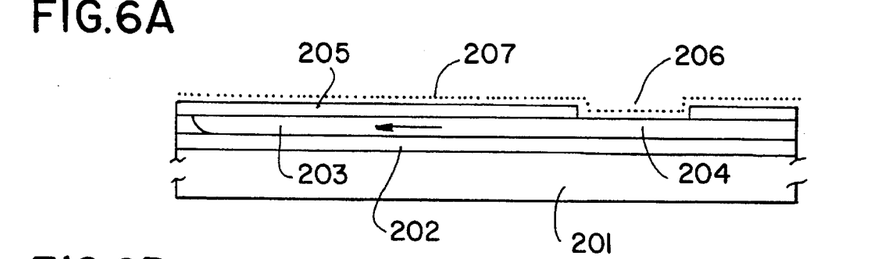
FIGS. 6A–6F show a process of manufacturing a TFT in accordance with Example 6 of the invention.

Referring to FIG. 6A, a substrate 201 is washed and provided with a silicon oxide film 202 on its surface. The silicon oxide film 202 is formed through a plasma CVD with oxygen and tetraethoxysilane used as starting gases. The thickness of the silicon oxide film is 2000 Å, for example. Then, an amorphous silicon film 203 of an intrinsic type of a thickness of 500–1500 Å, for example, 1000 Å is formed on the silicon oxide film 202, following which a silicon oxide film 205 of 500–2000 Å, for example 1000 Å is formed on the amorphous silicon film successively. Further, the silicon oxide film 205 is selectively etched in order to form an opening 206 at which the amorphous silicon film is exposed.

Then, a silicon oxide film 207 containing nickel for promoting a crystallization of silicon is formed in the same manner as in Example 3.

After the prebaking as discussed in Example 3, the silicon oxide film 207 is removed and the substrate is annealed at 500°–620° C. for 4 hours in a nitrogen atmosphere to crystallize the silicon film 203. The crystallization starts from the region under the opening 206 where the silicon film directly contacts the nickel containing silicon oxide film and further proceeds in a direction parallel with the substrate. In the figure, a reference numeral 204 indicates a region of the silicon film where the silicon film is directly added with nickel and crystallized while a reference numeral 203 indicates a portion where the crystal grows in a lateral direction. The crystals grown in the lateral direction are about 25 μm in length. Also, the direction of the crystal growth is approximately along the crystalline axis of [111].

Figure 6B:
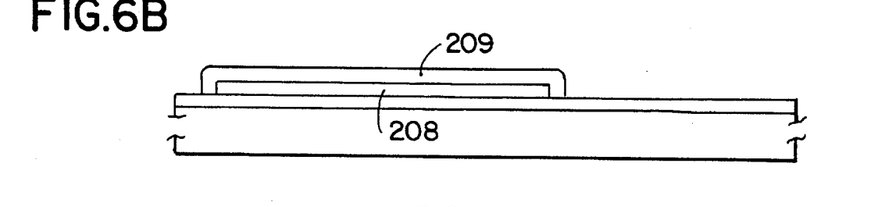

After the crystallization, the silicon oxide film 205 is removed. At this time, an oxide film which exists on the silicon film in the opening 206 is simultaneously removed. Further, the silicon film is patterned by dry etching to form an active layer 208 in the form of an island as shown in FIG. 6B. It should be noted that the nickel is contained in the silicon film at a higher concentration not only under the opening 206 where the nickel is directly added but also at a portion where top ends of the crystals exist. The patterning of the silicon film should be done in such a manner that the patterned silicon film 208 should not include such portions in which nickel is contained at a higher concentration.

Referring to FIG. 6B, the patterned active layer 208 is then exposed to an atmosphere containing 100% aqueous vapor of 10 atm at 500°–600° C., typically, 550° C. for one hour in order to oxidize the surface thereof and thus to form a silicon oxide film 209 of 1000 Å. After the oxidation, the substrate is maintained in an ammonium atmosphere (1 atm, 100%) at 400° C. At this condition, the silicon oxide film 209 is irradiated with an infrared light having an intensity peak at a wavelength in the range of 0.6–4 μm, for example, 0.8–1.4 μm for 30–180 seconds in order to nitride the silicon oxide film 209. HCl may be added to the atmosphere at 0.1 to 10%. A halogen lamp is used as a light source of the infrared light. The intensity of the IR light is controlled so that a temperature on the surface of a monitoring single crystalline silicon wafer is set between 900°–1200° C. More specifically, the temperature is monitored by means of a thermocouple embedded in a single crystal silicon wafer and is transferred back to the IR light source (feed back). In the present example, the temperature rising rate is kept constant in the range of 50°–200° C./sec. and also the substrate is cooled naturally at 20°–100° C./sec. Since the IR light can heat the silicon film selectively, it is possible to minimize the heating of the glass substrate.

Figure 6C:
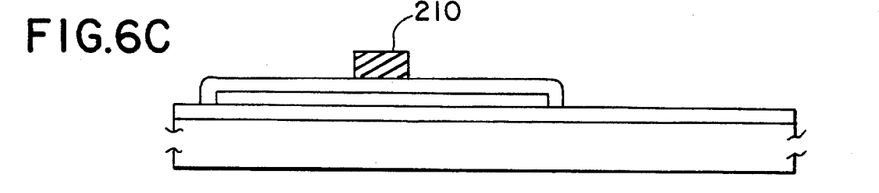

Referring to FIG. 6C, an aluminum film is formed by sputtering to a thickness of 3000–8000 Å, for example, 6000 Å and then patterned into a gate electrode 210. The aluminum film may preferably contain scandium at 0.01–0.2%.

Figure 6D:
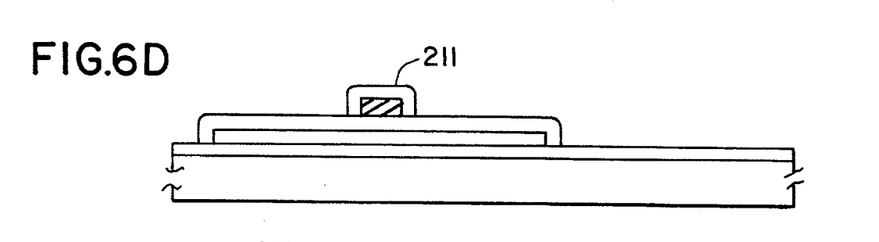

Then, as shown in FIG. 6D, the surface of the aluminum electrode is anodic oxidized to form an anodic oxide film 211. The anodic oxidation is performed in an ethylene glycol solution containing a tartaric acid at 1–5%. The thickness of the anodic oxide film is 2000 Å. The thickness of the anodic oxide film 211 will determine the thickness of an offset gate area as discussed below.

Figure 6E:
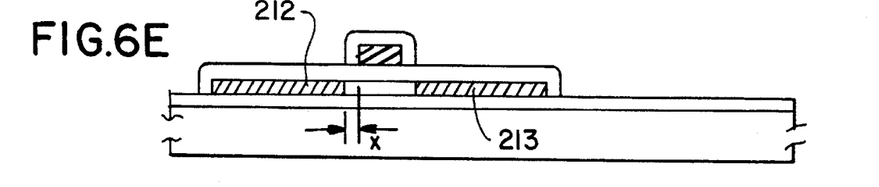

Referring then to FIG. 6E, using the gate electrode and the surrounding anodic oxide film as a mask, an N-type conductivity impurity (phosphorous, here) is introduced into the active layer in a self-aligning manner by ion doping method in order to form impurity regions 212 and 213. Phosphine ($PH_3$) is used as a dopant gas. The acceleration voltage is 60–90 kV, for example, 80 kV. The dose amount is $1\times10^{15}$–$8\times10^{15}$ $cm^{-2}$, for example, $4\times10^{15}$ $cm^{-2}$. As can be seen in the drawing, the impurity regions 212 and 213 are offset from the gate electrode by a distance "x". This configuration is advantageous for reducing a leak current (off current) which occurs when applying a reverse bias voltage (i.e. a negative voltage in the case of an NTFT) to the gate electrode. In particular, since it is desired that electric charges stored in a pixel electrode be maintained without leaking in order to obtain an excellent display, the offset configuration is particularly advantageous when the TFT is used for switching a pixel of an active matrix as is the case in the present example.

Thereafter, an annealing is performed with a laser irradiation. As a laser, a KrF excimer laser (wavelength: 248 nm, pulse width: 20 nsec.) or other lasers may be used. The conditions of the laser irradiation in the case of KrF excimer laser are: energy density is 200–400 $mJ/cm^2$, for example, 250 $mJ/cm^2$, a number of shots is 2–10 shots per one site, for example, 2 shots. Preferably, the substrate is heated to 200°–450° C. to enhance the effect of the irradiation.

Figure 6F:
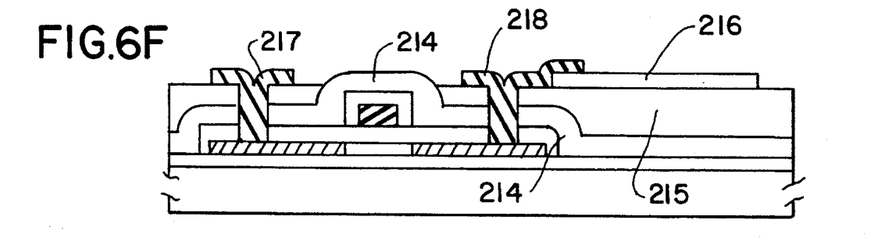

Referring to FIG. 6F, an interlayer insulating film 214 of silicon oxide is formed through a plasma CVD to a thickness of 6000 Å. Further, a transparent polyimide film 215 is formed by spin coating to obtain a leveled surface. Then, a transparent conductive film made of indium tin oxide for example is formed on the leveled surface by sputtering to a thickness of 800 Å and patterned into a pixel electrode 216.

The interlayer insulating films 214 and 215 are provided with contact holes therethrough, through which electrode/wirings 217 and 218 are formed to contact the impurity regions of the TFT. The electrode/wirings 217 and 218 are formed of a metallic material, for example, a multi-layer of titanium nitride and aluminum. Finally, an annealing in a hydrogen atmosphere of 1 atm is carried out at 350° C. for 30 minutes in order to complete a pixel circuit of an active matrix circuit having TFTs.

EXAMPLE 7

This example is directed to a manufacture of a TFT and will be described with reference to FIGS. 7A–7D.

Figure 7A:
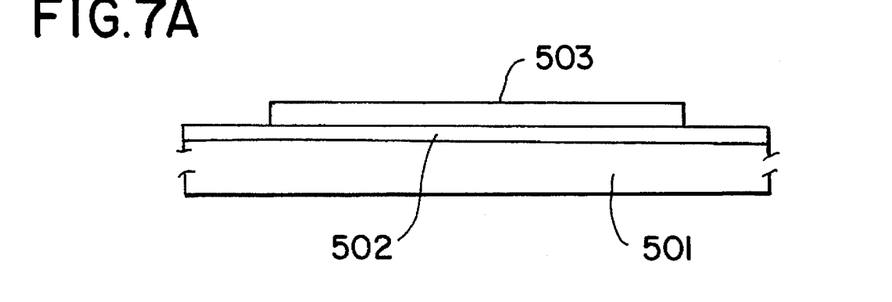
FIGS. 7A–7D show a process of manufacturing a TFT in accordance with Example 7 of the invention.

Referring to FIG. 11A, a base film 502 of silicon oxide is initially formed on a Corning 7059 substrate 501 by sputtering to 2000 Å thick. The substrate is preferably annealed at a temperature higher than a distortion point of the substrate following which the glass is cooled to a temperature less than the distortion point at a rate of 0.1°–1.0° C./minute. Thereby, it is possible to reduce a contraction of the substrate due to a substrate heating which occurs later (for example, thermal oxidation, thermal annealing), as a result, a mask alignment process will be facilitated. This step may be performed either before or after the formation of the base film 502 or it may be done both before and after the formation of the base film 502. In the case of using the Corning 7059 substrate, the substrate is heated at 620°–660° C. for 1–4 hours, following which it is cooled at 0.1°–0.3° C. per minute and taken out from a furnace when the temperature decreases to 400°–500° C.

Then, an intrinsic (I-type) amorphous silicon film is formed to 500–1500 Å thick, for example, 1000 Å through a known plasma CVD. The amorphous silicon film is crystallized in the same manner as in Example 1. Therefore, the redundant explanation will be omitted. After the crystallization, the silicon film is patterned into an island form of 10–1000 microns square. Accordingly, a crystalline silicon film 503 in the form of an island is formed as an active layer of a TFT as shown in FIG. 7A.

Figure 7B:
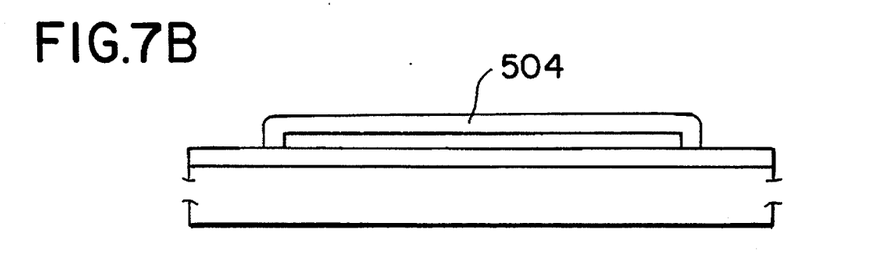

Referring to FIG. 7B, the surface of the silicon film is oxidized by exposing the surface to an oxidizing atmosphere to form an oxide film 504. The oxidizing atmosphere contains an aqueous vapor at 70–90%. The pressure and the temperature of the atmosphere is 1 atm and 500°–750° C., typically 600° C. The atmosphere is produced by a pyrogenic reaction from oxygen and hydrogen gases with a hydrogen/oxygen ratio being 1.5–1.9. The silicon film is exposed to the thus formed atmosphere for 3–5 hours. As a result, the oxide film 209 having a thickness of 500–1500 Å, for example, 1000 Å is formed. Since the surface of the silicon film is reduced (eaten) by 50 Å or more due to the oxidation, an influence of a contamination of the upper most surface of the silicon film does not extend to the silicon/silicon oxide interface. In other words, by the oxidation, it is possible to obtain a clean silicon/silicon oxide interface. Also, since the thickness of the silicon oxide film is two times as the thickness of the portion of the silicon film to be oxidized, when the silicon film is originally 1000 Å thick and the obtained silicon oxide film is 1000 Å thick, the thickness of the silicon film remaining after the oxidation is 500 Å.

Generally, the thinner a silicon oxide film (a gate insulating film) and an active layer are, the higher a mobility is and the smaller an off current is. On the other hand, a preliminary crystallization of an amorphous silicon film is easier when its thickness is thicker. Accordingly, there is a contradiction in the crystallization process and electrical characteristics with respect to the thickness of the active layer. The present example solves this problem. That is, the amorphous silicon film having a larger thickness is initially formed so that a better crystalline silicon film can be obtained, following which the thickness of the silicon film is reduced by the oxidation, resulting in an improvement of characteristics of the active layer of a TFT. Moreover, an amorphous component or grain boundaries contained in the crystalline silicon film tend to be oxidized during the thermal oxidation, resulting in a decrease in recombination centers contained in the active layer. As a result, the production yield can also be improved.

After the formation of the silicon oxide film 209 through thermal oxidation, the substrate is annealed in a 100% monoxide dinitrogen atmosphere at 1 atm and 600° C. for 2 hours.

Figure 7C:
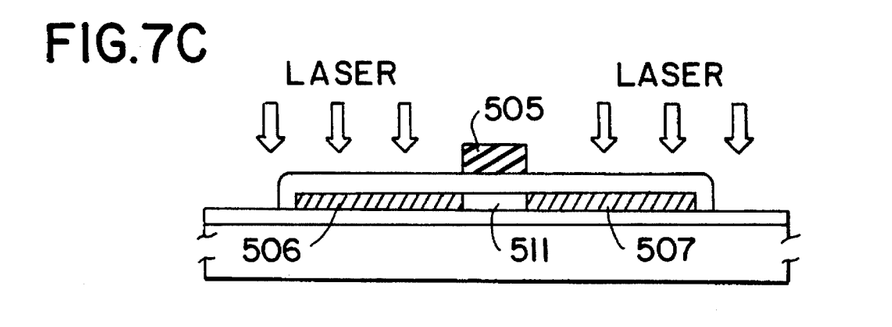

Referring to FIG. 6C, silicon containing 0.01 to 0.2% phosphorous is deposited through low pressure CVD to 3000–8000 Å thick, for example, 6000 Å, and then patterned into a gate electrode 505. Further, using the gate electrode 505 as a mask, an N-type conductivity impurity is added into a portion of the active layer in a self-aligning manner by ion doping. Phosphine is used as a dopant gas. The acceleration voltage is 60–90 kV, for example, 80 kV. The dose amount is, $1\times10^{15}$ to $8\times10^{15}$ atoms/cm$^2$ for example, $5\times10^{15}$ cm$^{-2}$. Thus, N-type impurity regions 506 and 507 are formed. Also, a channel region 511 is simultaneously formed in a self-aligning manner.

Thereafter, an annealing is performed with a KrF excimer laser (wavelength 248 nm, pulse width 20 nsec). The laser annealing may be replaced by a lamp annealing with a near infrared ray. The near infrared ray is absorbed by crystalline silicon more effectively than by amorphous silicon. Accordingly, the use of a near infrared ray is comparable with a thermal annealing at 1000° C. or more. On the other hand, it is possible to prevent the glass substrate from being detrimentally heated inasmuch as the near infrared ray is not so absorbed by the glass substrate. That is, while a far infrared ray is absorbed by a glass substrate, visible or near infrared ray of which wavelength ranges from 0.5–4 μm are not so absorbed. Accordingly, it is possible to anneal the silicon film for a short duration without heating the glass substrate and causing a contraction.

Figure 7D:
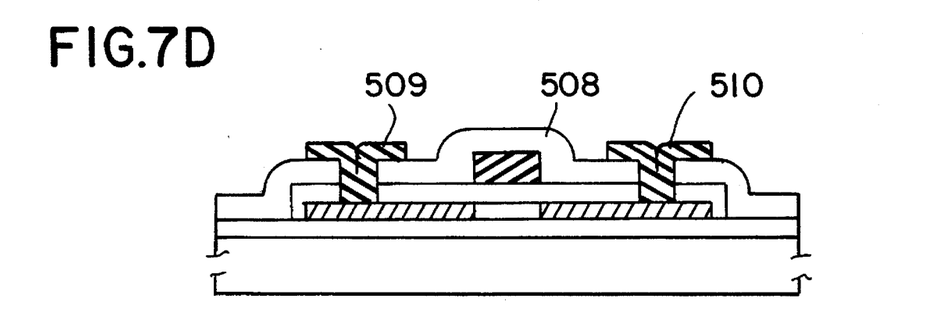

Referring to FIG. 7D, an interlayer insulating film 508 of silicon oxide is formed to 6000 Å thick by a plasma CVD. A polyimide may be used instead of silicon oxide. Further, contact holes are formed through the insulating film. Electrode/wirings 509 and 510 are formed through the contact holes by using a multilayer of titanium nitride and aluminum films. Finally, an annealing in a hydrogen atmosphere is conducted at 350° C. and 1 atm for 30 minutes. Thus, a TFT is completed.

The mobility of the thus formed TFT is 110–150 cm$^2$/Vs. The S value is 0.2–0.5 V/digit. Also, in the case of forming a P-channel type TFT by doping boron into source and drain regions, the mobility is 90–120 cm$^2$/Vs and the S value is 0.4–0.6 V/digit. The mobility in accordance with the present example can be increased by 20% or more and the S value can be reduced by 20% or more as compared with a case where a gate insulating film is formed by a known PVD or CVD.

Also, the reliability of the TFT in accordance with the present example is comparable to that of a TFT which is produced through a thermal oxidation at a temperature as high as 1000° C.

EXAMPLE 8

Figure 8:
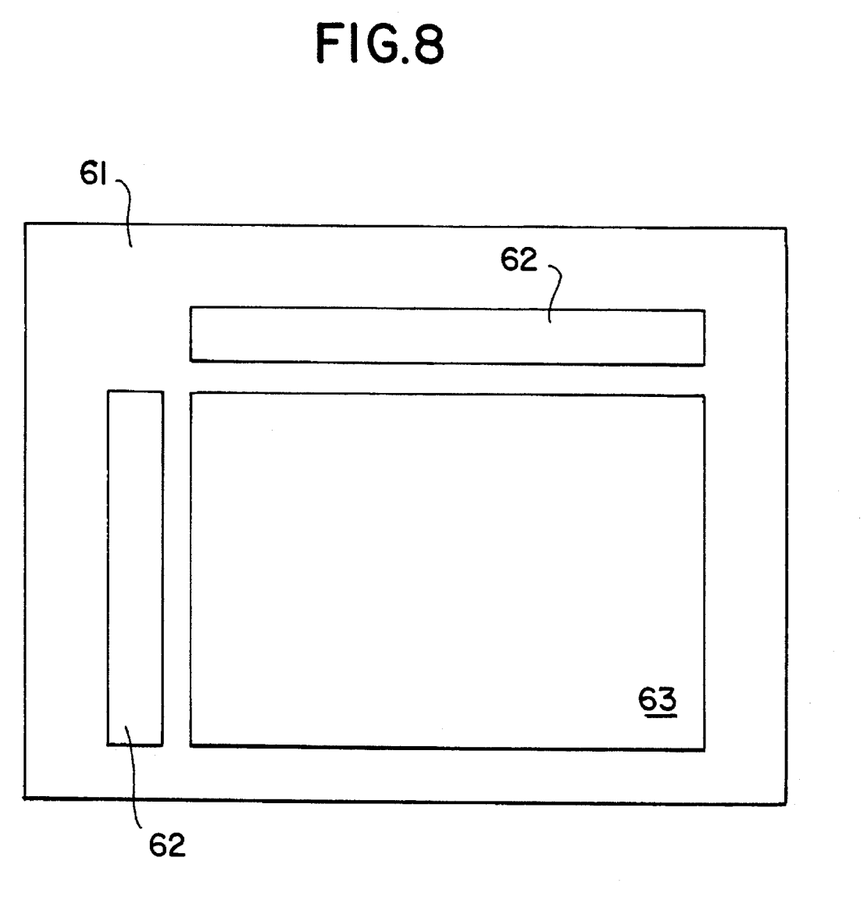
FIG. 8 is an example of an integrated circuit substrate used in an active matrix liquid crystal device.

FIG. 8 shows an example of an active matrix type liquid crystal device in accordance with the present example.

In the figure, reference numeral 61 shows a glass substrate, and 63 shows a pixel area having a plurality of pixels of several hundreds x several hundreds in the form of a matrix each of which is provided with a TFT as a switching element. Reference numeral 62 shows peripheral driver region(s) in which a driver circuit and a decoder circuit are formed by using TFTs for driving the TFTs of the pixel area. The pixel area 63 and the driver region 62 are united on the same substrate 61.

The TFTs provided in the driver region 62 need to have a high mobility in order to allow a large amount of electric currents to pass therethrough. Also the TFTs provided in the pixel area 63 need to have a lower leak current property in order to increase a charge retention ability of pixel electrodes. For example, the TFTs for the driver circuit in the peripheral area can be manufactured in accordance with the present invention while the TFTs for the pixel area is not intentionally added with a catalyst. Namely, an amorphous silicon film is initially formed on the entire surface of the substrate. Then, the catalyst such as nickel is selectively introduced only to the peripheral region of the semiconductor layer in accordance with the present invention. After the heat crystallization, only the peripheral region of the semiconductor layer is mainly crystallized while the pixel region of the semiconductor layer is not crystallized. However, there may be some diffusion of nickel from the peripheral region into the pixel region but the amount of this diffusion is insignificant. Then, the entire region of the semiconductor layer is irradiated with a laser light in order to increase the crystallinity, following which the semiconductor layer is patterned into respective silicon islands to form transistors. Thereby, it is possible to manufacture a driver circuit using higher crystallinity TFTs and an active matrix circuit using lower crystallinity TFTs on one substrate.

EXAMPLE 9

This example is directed to an improved method for forming a film which is added with a catalyst onto an amorphous silicon film more uniformly. The inventors were aware of a problem that when a solution containing for example nickel or nickel compound as a catalyst is applied onto an amorphous silicon, there is a tendency that the surface of the amorphous silicon film repels the solution so that the uniformity of the coating is not so good. The inventor discovered that when there is a very thin oxide film on the amorphous silicon film, it is possible to improve the wettability of the surface and therefore the solution may be coated more uniformly. The oxide film should be enough thin so that the nickel can penetrate through the oxide film. The appropriate thickness is, for example, about 10 Å. Also, the oxide film may be formed by a UV oxidation or thermal oxidation.

For example, in the case of a UV oxidation, a surface of an amorphous silicon film is exposed to a UV light in an oxygen gas for 3 to 5 minutes. The temperature of the substrate may be a room temperature. However, it is desirable to heat the substrate to a temperature at which ozone starts to decompose to form oxygen radical, namely, about 200° C. In such a case, the time required for the oxidation is shorter than the case of the room temperature by about 1 minute.

Alternatively, the oxide film may be formed by immersing the substrate having the amorphous silicon formed thereon into a hydrogen peroxide solution at 70° C. for 5 minutes. Preferably, the hydrogen peroxide solution is mixed with ammonium for the purpose of cleaning the surface. Instead of ammonium, it is possible to add sulfuric acid or hydrochloric acid.

In any event, the wettability of the silicon film is increased by the provision of the thin oxide film. This method is applicable not only to the method using a solution for forming silicon oxide such as OCD as disclosed in the Examples 1 to 7 but also applicable to other methods in which nickel or nickel is dissolved by a solvent such as water or alcohol and this solution is added onto the amorphous silicon film.

Although a silicon oxide film is disclosed as a most preferred example for holding a catalyst element therein, other materials may be used instead of silicon oxide as long as they can endure a high temperature, for example, an alumina may be used by dissolving fine particles of alumina in an organic solvent to form an alumina film instead of silicon oxide. Also, an organic film such as photoresist material may be used to suspend a catalyst element therein. Also, while the examples are directed only to a manufacture of a TFT of a coplanar type, it is to be understood that other known types of transistors such as a bottom gate type transistor may be manufactured in accordance with the present invention.

What is claimed is:

1. A method for manufacturing a semiconductor device on a substrate comprising the steps of:

disposing in contact with a semiconductor layer comprising silicon a precursor material for forming silicon oxide, wherein the precursor material includes a metal or a metal compound capable of promoting a crystallization of said semiconductor layer;

prebaking said substrate in order to form a film comprising silicon oxide from the precursor material;

diffusing said metal or metal compound into said semiconductor film by heating; and annealing said semiconductor layer in order to crystallize said semiconductor layer.

2. The method of claim 1 wherein said metal is selected from the group consisting of Pd, Pt, Cu, Ag, Au, In, Sn, Pb, P, As, Sb and Ni.

3. The method of claim 1 wherein said semiconductor layer is amorphous.

4. The method of claim 1 wherein said film is disposed between said substrate and said semiconductor layer.

5. The method of claim 1 wherein said annealing is performed at a temperature not higher than 500° C.

6. The method of claim 1 wherein said film is formed on said semiconductor film.

7. The method of claim 1 wherein said film mainly comprises silicon oxide.

8. A method for manufacturing a semiconductor device on a substrate comprising the steps of:

disposing in contact with a semiconductor layer comprising silicon a precursor material for forming silicon oxide, wherein the precursor material includes a metal or a metal compound capable of promoting a crystallization of said semiconductor layer;

prebaking said substrate in order to form a film comprising silicon oxide from the precursor material; and annealing said semiconductor layer in order to crystallize said semiconductor layer, wherein said metal or metal compound diffuses into said semiconductor film during crystallization.

9. The method of claim 8 wherein said metal is selected from the group consisting of Pd, Pt, Cu, Ag, Au, In, Sn, Pb, P, As, Sb and Ni.

10. The method of claim 8 wherein said semiconductor layer is amorphous.

11. The method of claim 8 wherein said film is disposed between said substrate and said semiconductor layer.

12. The method of claim 8 wherein said annealing is performed at a temperature not higher than 500° C.

13. The method of claim 8 wherein said film is formed on said semiconductor film.

14. A method for manufacturing a semiconductor device comprising the steps of:

forming a semiconductor layer comprising silicon on a substrate;

coating said semiconductor layer with a liquid precursor material for forming silicon oxide, wherein said liquid precursor material is added with a metal or a metal compound capable of promoting a crystallization of said semiconductor layer;

prebaking said substrate in order to form a film comprising silicon oxide from said liquid precursor;

annealing said semiconductor layer in order to crystallize said semiconductor layer, wherein said metal or metal compound diffuses through said semiconductor film during crystallization.

15. The method of claim 14 wherein said liquid precursor material comprises an organic solvent.

16. The method of claim 14 wherein said liquid precursor material is coated on said semiconductor layer by spin coating.

17. The method of claim 14 further comprising the step of increasing a crystallinity of said semiconductor layer by irradiating light after said annealing.

18. A method for manufacturing a semiconductor device comprising the steps of:

forming a semiconductor layer comprising silicon on a substrate, said semiconductor layer having at least a first region and a second region adjacent to each other;

forming a precursor material for forming silicon oxide, wherein the precursor material includes a catalyst for promoting a crystallization of said semiconductor layer on only the first region of said semiconductor layer;

prebaking said substrate in order to form a film comprising silicon oxide from the precursor material;

diffusing said catalyst into the first region of said semiconductor layer; and heating said semiconductor layer so that said catalyst diffuses from the first region of said semiconductor layer into the second region of said semiconductor layer adjacent thereto, thereby, crystallizing said second region of the semiconductor layer.

19. The method of claim 18 wherein said film mainly comprises silicon oxide.

20. The method of claim 18 wherein crystals grow in said second region in a direction substantially parallel with a surface of said substrate.

21. The method of claim 18 further comprising the step of removing said first region after the crystallization thereof to remain an active region of said semiconductor device within said second region.

22. A method for manufacturing a semiconductor device comprising the steps of:

preparing a liquid precursor material for forming silicon oxide, wherein said precursor material is added with a metal or a metal compound capable of promoting a crystallization of silicon;

forming a semiconductor film comprising silicon on a substrate;

coating said precursor material onto said semiconductor film;

prebaking said substrate to form a silicon oxide film containing said metal or metal compound on said semiconductor film;

patterning said silicon oxide film so that only a selected region of said semiconductor layer is provided said silicon oxide film; and heating said semiconductor layer to crystallize said semiconductor layer, wherein said metal or metal compound is diffused into said semiconductor layer during said heating.

23. The method of claim 22 wherein said prebaking is carried out at such a low temperature that said metal or metal compound does not substantially diffuse into said semiconductor layer.

24. The method of claim 22 further comprising the step of irradiating said semiconductor layer with light to increase a crystallinity thereof after said heating.

25. A method for manufacturing of semiconductor device comprising the steps of:

forming a semiconductor film comprising silicon on a substrate;

oxidizing a surface of said semiconductor film to form an oxide film on said semiconductor film;

applying a precursor material for forming silicon oxide, wherein the precursor material includes a metal or metal compound onto said oxide film, said metal or metal compound being capable of promoting a crystallization of said semiconductor film;

prebaking said substrate in order to form a film comprising silicon oxide from the precursor material;

diffusing said metal or metal compound into said semiconductor film through said oxide film, wherein said oxide film is sufficiently thin to allow said metal or metal compound to penetrate therethrough; and crystallizing said semiconductor film by heating.

26. The method of claim 25 wherein said oxide film is formed by thermal oxidation.

27. The method of claim 25 wherein said oxide film is formed by ultraviolet photo enhanced oxidation.

28. The method of claim 25 wherein said oxide film is formed by exposing a surface of said semiconductor film to a hydrogen peroxide solution.

29. The method of claim 28 wherein said hydrogen peroxide solution includes a material selected from the group consisting of ammonium, sulfuric acid, and hydrochloric acid.

30. A method for manufacturing a semiconductor device on a substrate comprising the steps of:

disposing, in contact with a semiconductor layer comprising silicon, a solution in which at least a silicon compound is dissolved in an organic solvent, wherein the solution includes a metal or a metal compound for promoting a crystallization of the semiconductor layer;

prebaking the substrate in order to form a film comprising silicon oxide from the solution comprising the metal or metal compound; and annealing the semiconductor layer in order to crystallize the semiconductor layer, wherein the metal or metal compound diffuses into the semiconductor film during crystallization.

* * * * *